US008098701B2

United States Patent
Sugiyama et al.

(10) Patent No.: US 8,098,701 B2
(45) Date of Patent: Jan. 17, 2012

(54) QUANTUM CASCADE LASER ELEMENT

(75) Inventors: Atsushi Sugiyama, Hamamatsu (JP);
Takahide Ochiai, Hamamatsu (JP);
Kazuue Fujita, Hamamatsu (JP); Naota Akikusa, Hamamatsu (JP); Tadataka Edamura, Hamamatsu (JP); Shinichi Furuta, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 12/194,946

(22) Filed: Aug. 20, 2008

(65) Prior Publication Data
US 2009/0052488 A1 Feb. 26, 2009

(30) Foreign Application Priority Data

Aug. 23, 2007 (JP) ................. P2007-217395

(51) Int. Cl.
*H01S 5/00* (2006.01)
*H01S 3/08* (2006.01)
(52) U.S. Cl. ................ 372/45.012; 372/96
(58) Field of Classification Search ........... 372/45.012, 372/96
See application file for complete search history.

(56) References Cited

U.S. PATENT DOCUMENTS

| 6,400,744 | B1 * | 6/2002 | Capasso et al. | 372/96 |
| 2003/0042495 | A1 * | 3/2003 | Ogasawara et al. | 257/102 |
| 2004/0013144 | A1 * | 1/2004 | Kise et al. | 372/45 |
| 2004/0161009 | A1 * | 8/2004 | Edamura et al. | 372/45 |

FOREIGN PATENT DOCUMENTS

JP    10-321951    12/1998
* cited by examiner

*Primary Examiner* — Patrick Stafford
(74) *Attorney, Agent, or Firm* — Drinker Biddle & Reath LLP

(57) ABSTRACT

A DFB quantum cascade laser element that can reliably CW-oscillate a single-mode light even at room temperature or a temperature in proximity thereof is provided. In a quantum cascade laser element 1, a top-grating approach for which a diffraction grating 7 is formed on a laminate 3 is adopted, and thus in comparison with a buried-grating approach, deterioration in temperature characteristics of the laser element and decline in the yield and reproducibility are suppressed. In addition, since the thickness of a cladding layer 5 located between an active layer 4 and the diffraction grating 7 is within a range of 42±10% of the oscillation wavelength, weakening of light seeping from the active layer 4 to the diffraction grating 7 or an increase in light leakage is prevented. Consequently, by the quantum cascade laser element 1, a single-mode light can be reliably CW-oscillated even at room temperature or a temperature in proximity thereof.

4 Claims, 9 Drawing Sheets

Fig.6
(a)
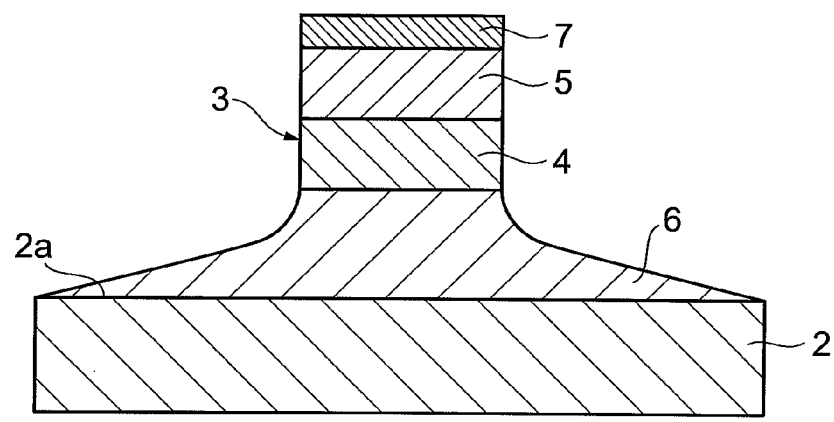
(b)
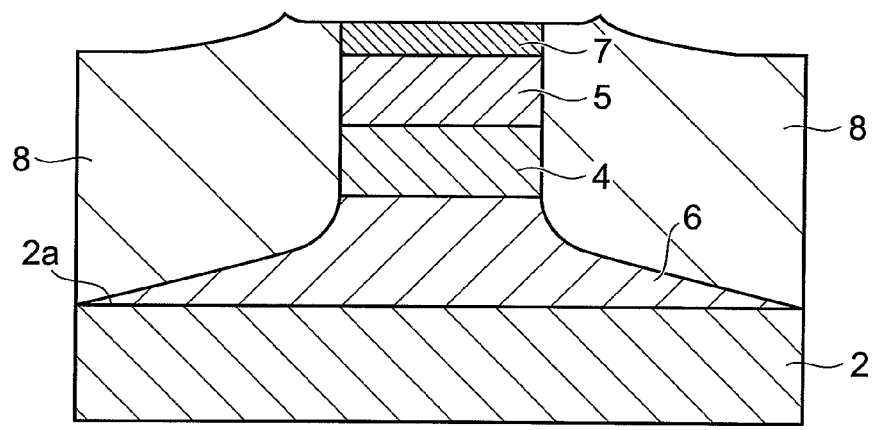

Fig.7
(a)
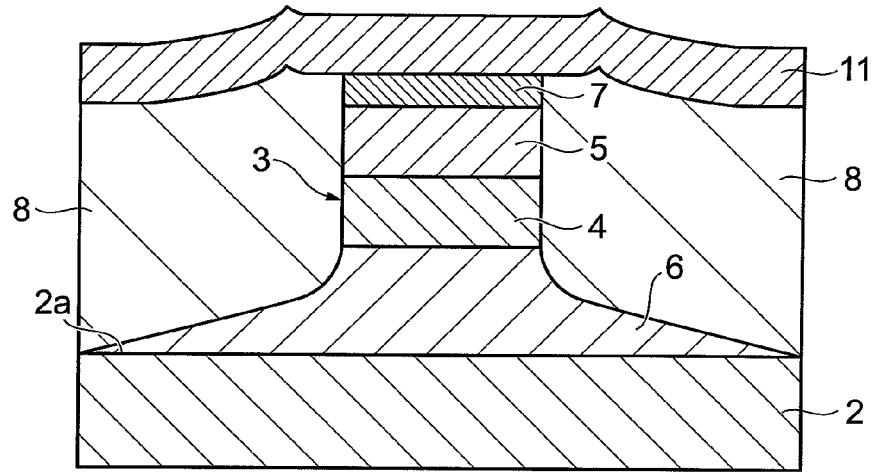
(b)
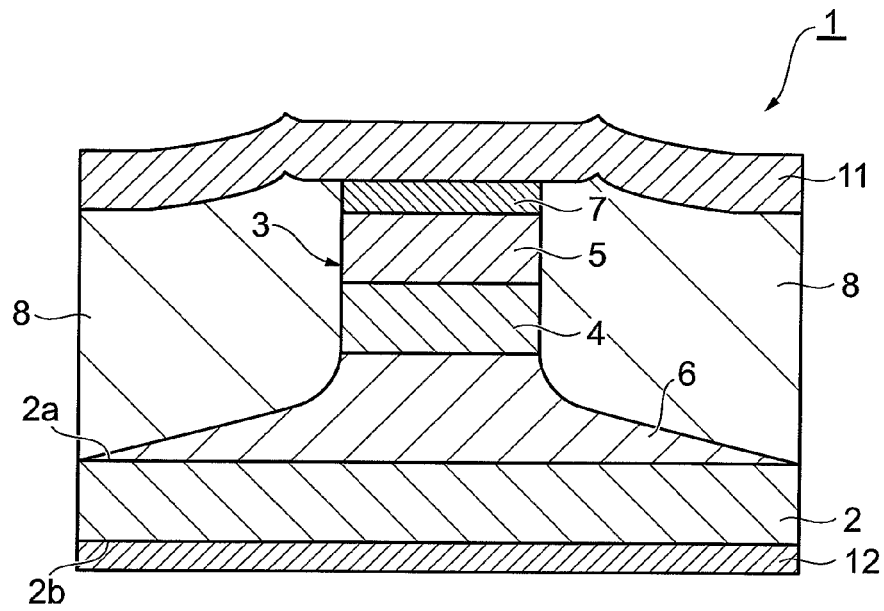

QUANTUM CASCADE LASER ELEMENT

BACKGROUND OF THE INVENTION

1. Field of the Invention

The present invention relates to a distributed feedback quantum cascade laser element that oscillates a single-mode light.

2. Related Background Art

The quantum cascade laser element is a monopolar type element that includes a laminate including an active layer formed by laminating emitting layers and injection layers alternately and can generate, in the active layer, light by electron transition between subbands in a quantum well structure. Quantum cascade laser elements are capable of realizing a high-efficiency and high-output operation by using alternately cascade-connected emitting layers and injection layers as active layers, and thus have received attention as sophisticated semiconductor light sources covering the mid-infrared region to the teraheltz (THz) region.

In the quantum cascade laser element, when voltage is applied to the laminate, electrons transit from an upper level to a lower level in a quantum level structure of the light emitting layer, and light with a wavelength according to a difference in energy between the levels is generated at the time of electron transition. The electrons that have transited to the lower level of the emitting layer move to the upper level of a next emitting layer through the adjoining injection layer, and similarly in the emitting layer as well, transit from the upper level to the lower level, and light with a wavelength according to a difference in energy between the levels is generated at the time of electron transition. In this manner, light is generated in each emitting layer.

Meanwhile, in the field of spectroscopic analysis aimed at environmental measurement, as a light source for this, a distributed feedback (DFB) quantum cascade laser element that is capable of continuous wave (CW) oscillation of a single-mode light at room temperature or a temperature in proximity thereof has been expected.

As a DFB quantum cascade laser element capable of CW oscillation of a single-mode light, described in Japanese Published Unexamined Patent Application No. H10-321951 is a top-grating type element including a stripe-structured laminate, having an active layer and cladding layers formed on both sides thereof, formed on a major surface of a substrate and a diffraction grating formed on the laminate.

Moreover, as a DFB quantum cascade laser element capable of CW oscillation of a single-mode light, also known is a buried-grating type element including a stripe-structured laminate, having an active layer and cladding layers formed on both sides thereof, formed on a major surface of a substrate and a diffraction grating formed between the active layer and cladding layer.

SUMMARY OF THE INVENTION

However, the top-grating type quantum cascade laser element described in Japanese Published Unexamined Patent Application No. H10-321951 has a problem that, since this is aimed at an operation at an extremely low temperature, it is absolutely impossible to CW-oscillate a single-mode light at room temperature or a temperature in proximity thereof according to the conditions described in Patent Document 1.

Moreover, the buried-grating type quantum cascade laser element has a problem that not only do temperature characteristics of the laser element deteriorate but the yield and reproducibility also decline. The reason for this is because, for forming a diffraction grating in the laminate being a semiconductor crystal layer, it is necessary to once take out the laminate from a growth furnace in the middle of crystal growth, and after forming a diffraction grating, again perform crystal growth on the diffraction grating in the growth furnace.

The present invention has therefore been made in view of such circumstances, and an object thereof is to provide a DFB quantum cascade laser element that can reliably CW-oscillate a single-mode light even at room temperature or a temperature in proximity thereof.

The inventors of the present application have devoted themselves to continuous study in order to attain the above-mentioned object, and discovered that, in a top-grating type quantum cascade laser element, the inability to reliably CW-oscillate a single-mode light at room temperature or a temperature in proximity thereof is caused by the thickness of the cladding layer located between the active layer and diffraction grating. That is, an optimal thickness of this cladding layer has a close relationship with the refractivity of a material to form the cladding layer and depends on the wavelength of light. And, when the thickness of the cladding layer located between the active layer and diffraction grating exceeds 42+10% of the wavelength of oscillating light (hereinafter, referred to as an "oscillation wavelength"), light seeping from the active layer to the diffraction grating is weakened and it thus becomes difficult to realize a DFB operation. On the other hand, when the thickness of the cladding layer located between the active layer and diffraction grating falls below 42−10% of the oscillation wavelength, light leakage is increased and it thus becomes difficult to realize CW oscillation at room temperature or a temperature in proximity thereof. Based on these findings, the inventors have continued their study and reached completion of the present invention.

More specifically, a quantum cascade laser element according to the present invention is a distributed feedback quantum cascade laser element that oscillates a single-mode light, including a substrate; a laminate having a stripe structure formed on a major surface of the substrate; and a diffraction grating formed on the laminate, wherein the laminate has an active layer and cladding layers formed on both sides of the active layer in a direction orthogonal to the major surface of the substrate, and the cladding layer located between the active layer and the diffraction grating has a thickness within a range of 42±10% of a wavelength of oscillating light.

In this quantum cascade laser element, a top-grating approach for which the diffraction grating is formed on the laminate is adopted, and thus in comparison with a buried-grating approach, deterioration in temperature characteristics of the laser element and decline in the yield and reproducibility are suppressed. In addition, since the thickness of the cladding layer located between the active layer and the diffraction grating is within a range of 42±10% of the oscillation wavelength, weakening of light seeping from the active layer to the diffraction grating or an increase in light leakage is prevented. Consequently, by this quantum cascade laser element, a single-mode light can be reliably CW-oscillated even at room temperature or a temperature in proximity thereof.

In the quantum cascade laser element according to the present invention, it is preferable that a material of the cladding layer located between the active layer and the diffraction grating is InP, the laminate is formed so that a section orthogonal to a stripe direction has a mesa shape, and an insulating layer is formed at both sides of the laminate on the major surface of the substrate. In these cases, CW oscillation of a single-mode light at room temperature or a temperature in proximity thereof can be made further reliable.

BRIEF DESCRIPTION OF THE DRAWINGS

FIG. 6 are process drawings for explaining a manufacturing method for the quantum cascade laser element of FIG. 1.

FIG. 7 are process drawings for explaining a manufacturing method for the quantum cascade laser element of FIG. 1.

DESCRIPTION OF THE PREFERRED EMBODIMENTS

Figure 1:
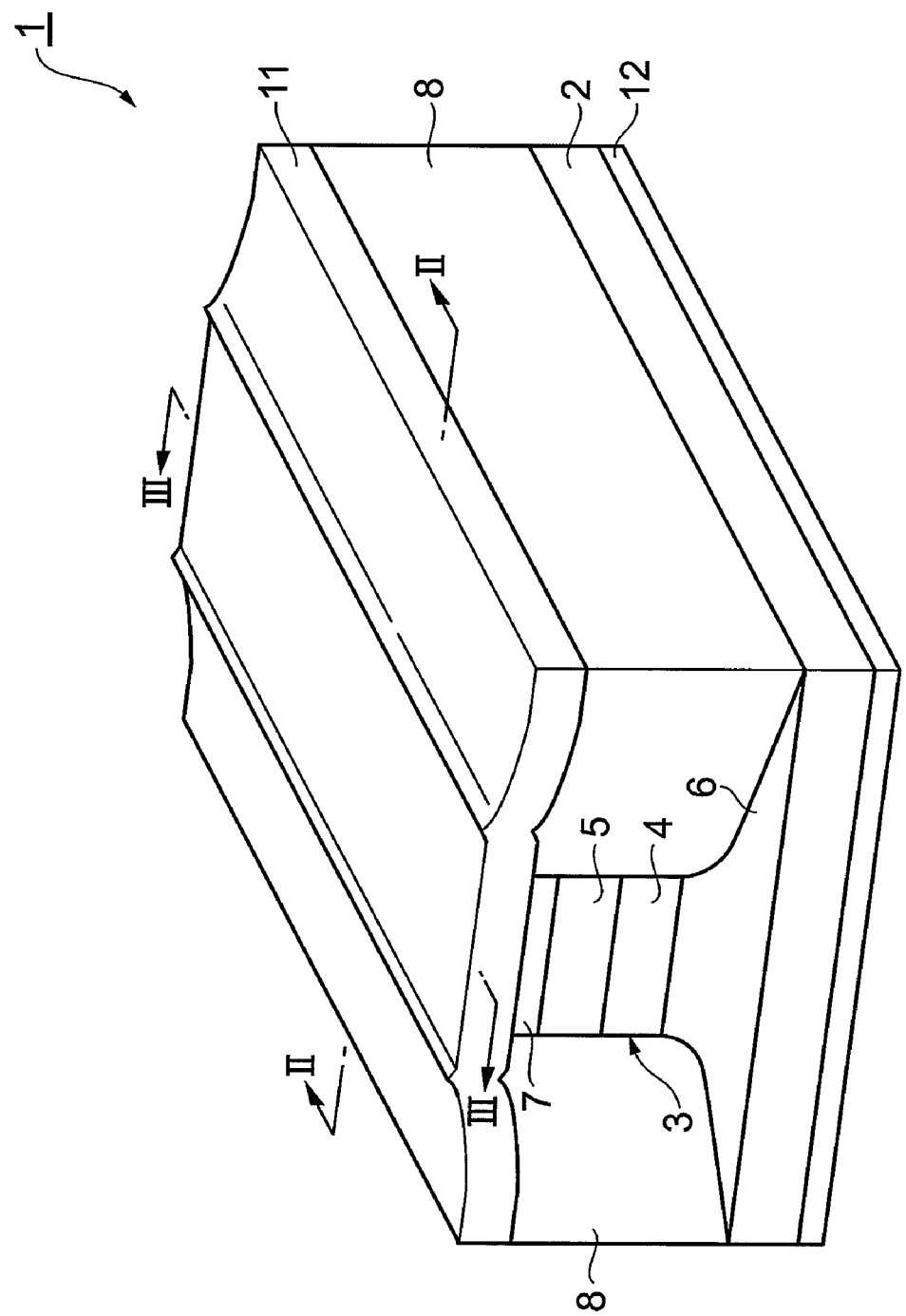
FIG. 1 is a perspective view of an embodiment of a quantum cascade laser element according to the present invention.

Hereinafter, preferred embodiments of the present invention will be described in detail with reference to the drawings. Also, the same or corresponding parts are denoted with the same reference numerals in each figure, and overlapping description will thus be omitted.

Figure 2:
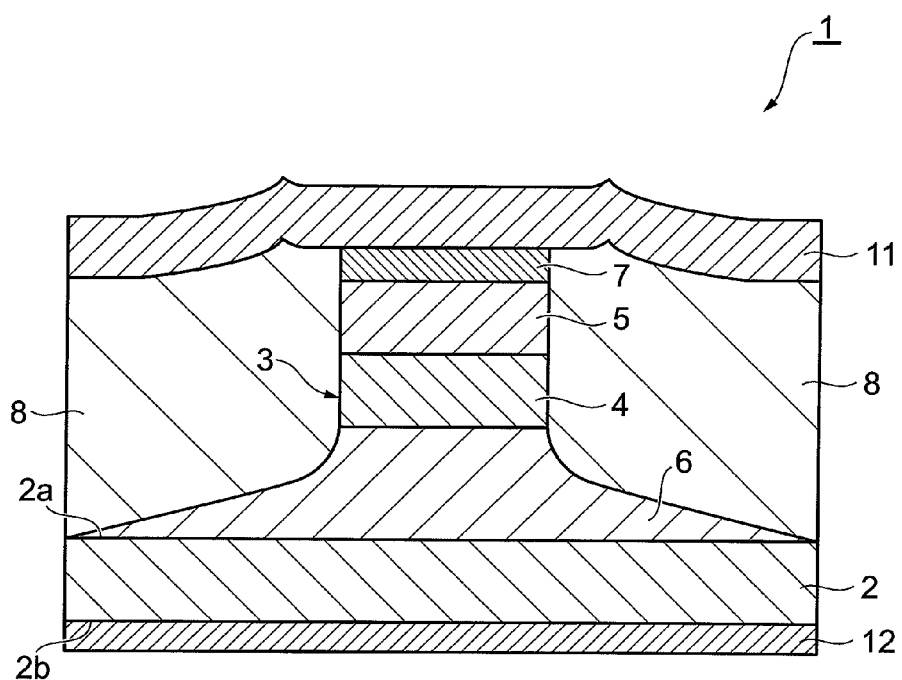
FIG. 2 is a sectional view along a line II-II of FIG. 1.
Figure 3:
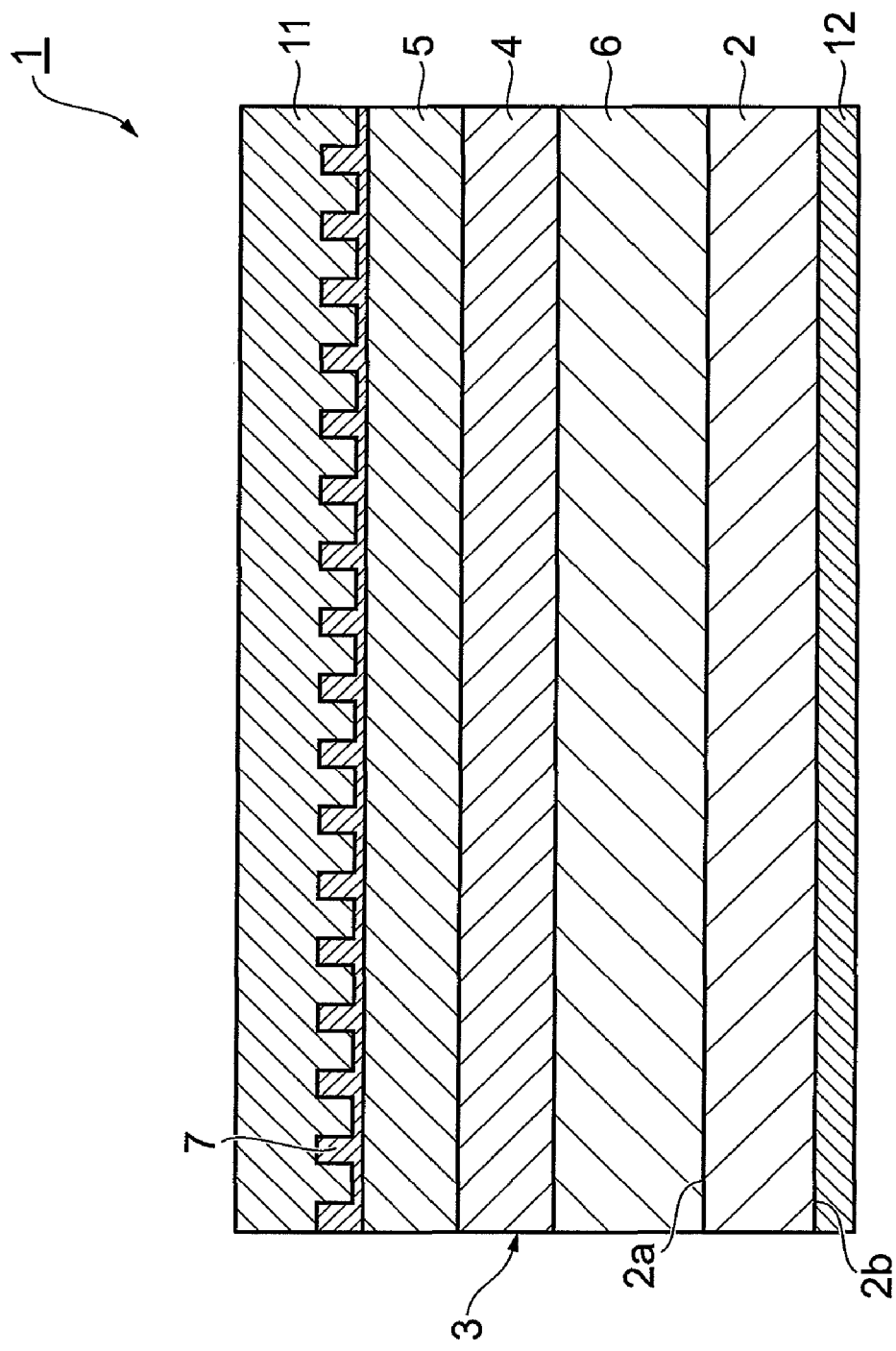
FIG. 3 is a sectional view along a line III-III of FIG. 1.

FIG. 1 is a perspective view of an embodiment of a quantum cascade laser element according to the present invention, FIG. 2 is a sectional view along a line II-II of FIG. 1, and FIG. 3 is a sectional view along a line III-III of FIG. 1. A quantum cascade laser element 1 is a DFB element that oscillates a single-mode light, and formed in an almost rectangular parallelepiped shape. On one major surface 2a of a substrate 2 having a rectangular thin plate shape, a laminate 3 having a stripe structure is formed. The laminate 3 is formed, with the longitudinal direction of the quantum cascade laser element 1 set as a stripe direction (resonance direction of light), so that a section orthogonal to the stripe direction has a mesa shape. Both end surfaces of the laminate 3 in the stripe direction serve as mirrors to form a laser resonator.

The laminate 3 has an active layer 4, a cladding layer 5 formed on one surface of the active layer 4, and a cladding layer 6 formed on the other surface of the active layer 4. More specifically, the cladding layers 5 and 6 are formed on both sides of the active layer 4 in a direction orthogonal to the major surface 2a of the substrate 2. The active layer 4, which is formed by alternately laminating emitting layers and injection layers, generates light by electron transition between subbands in a quantum well structure. Also, the thickness of the cladding layer 5 is within a range of 42±10% of the oscillation wavelength.

On one surface (more specifically, one surface of the cladding layer 5) of the laminate 3, formed is a diffraction grating 7 that causes a distributed feedback of light generated in the active layer 4, and at both sides the laminate 3 and the diffraction grating 7 on the major surface 2a of the substrate 2, an insulating layer 8 is formed. Further, on one surface of the diffraction grating 7 and the insulating layer 8, an electrode layer 11 is formed, and on the other major surface 2b of the substrate 2, an electrode layer 12 is formed. The electrode layers 11 and 12 are applied with voltage from the outside.

An example of composition of each part is as follows. The substrate 2 is made of InP. The active layer 4 is made of an InGaAs/InAlAs multiple quantum well structure, and the cladding layer 5, 6 is made of InP. The diffraction grating 7 is made of high-density InGaAs, and the insulating layer 8 is made of Fe-doped InP. The electron layer 11 is made of Ti/Au, and the electron layer 12 is made of AuGe/Au.

Figure 4:
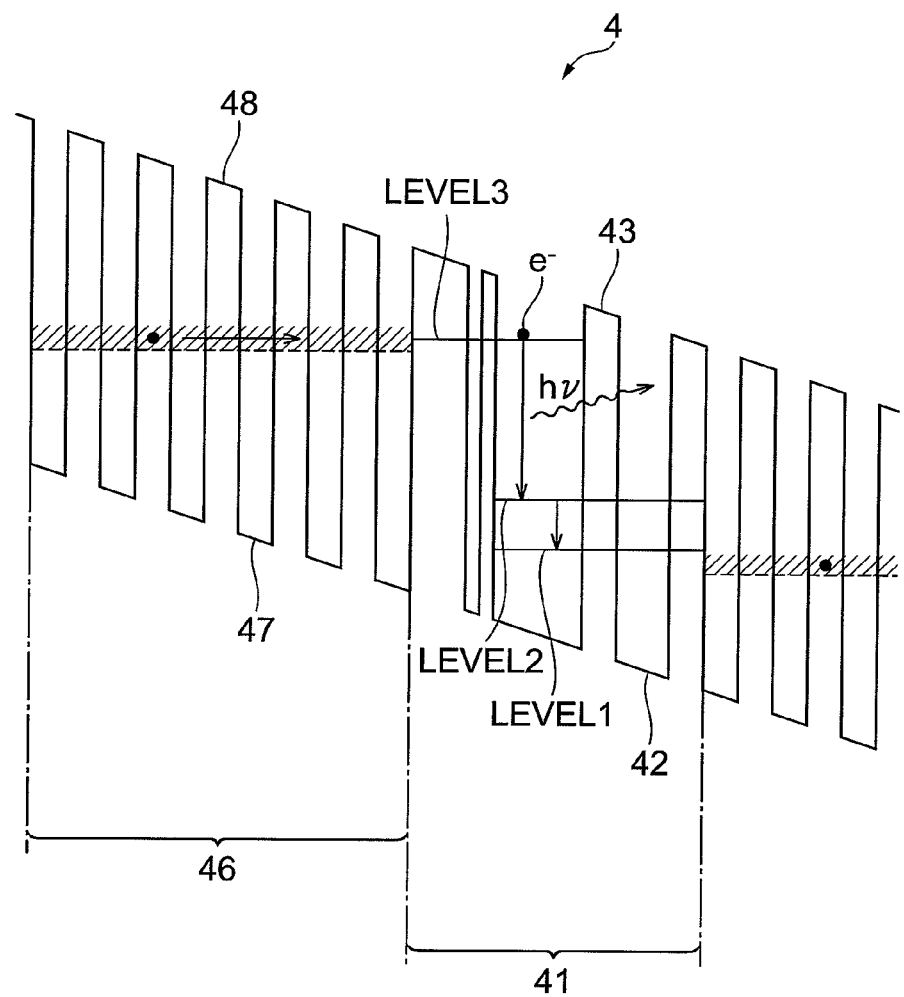
FIG. 4 is a schematic view for explaining a construction of an active layer of the quantum cascade laser element of FIG. 1 and electron transition between subbands in a quantum well structure of the active layer.

FIG. 4 is a schematic view for explaining a construction of an active layer of the quantum cascade laser element of FIG. 1 and electron transition between subbands in a quantum well structure of the active layer. In the same figure, the horizontal direction corresponds to a thickness direction of the active layer 4, and the vertical direction corresponds to an energy level. Moreover, in the same figure, for convenience of explanation, of multistage repeated structures of emitting layers and injection layers that compose the active layer 4, a laminated structure of each one adjacent layer of the emitting layer 41 and the injection layer 46 is shown.

The emitting layer 41 is composed of quantum well layers 42 and quantum barrier layers 43. The emitting layer 41 is a part that functions as an active region to generate light hv in a semiconductor laminated structure of the active layer 4. In FIG. 4, three quantum well layers having different thicknesses, respectively, are shown as the quantum well layers 42 of the light emitting layer 41. In the light emitting layer 41, three quantum levels of a level 1, a level 2, and a level 3 in order from the bottom are formed by the quantum well layers 42 and the quantum barrier layers 43. Moreover, between the emitting layer 41 and the next emitting layer 41, the injection layer 46 is provided. The injection layer 46 is composed of quantum well layers 47 and quantum barrier layers 48.

In the quantum cascade laser element 1, with a bias voltage applied to the laminate 3 having the active layer 4 with such a quantum level structure, electrons $e^-$ released from the injection layer 46 are injected into the level 3 of the emitting layer 41. The electrons $e^-$ injected into the level 3 emission-transit to the level 2, and at this time, light hv corresponding to an energy level difference between quantum levels of the level 3 and the level 2 is generated.

Moreover, the electrons $e^-$ that have transited to the level 2 are relaxed to the level 1 at a high speed, and are injected in a cascading manner into the next emitting layer level 3 through the injection layer 46. By repeating such an electron injection and emission transition in the laminated structure of the active layer 4, generation of light in a cascading manner occurs in the active layer 4. More specifically, as a result of alternately laminating the light emitting layers 41 and the injection layers 46 in large numbers, the electrons $e^-$ successively move in the emitting layer 41 in a cascading manner, and light hv is generated at the time of intersubband transition in each emitting layer 41. And, as a result such light hv being resonated by the optical resonator of the quantum cascade laser element 1, a single-mode laser beam is generated.

Figure 5:
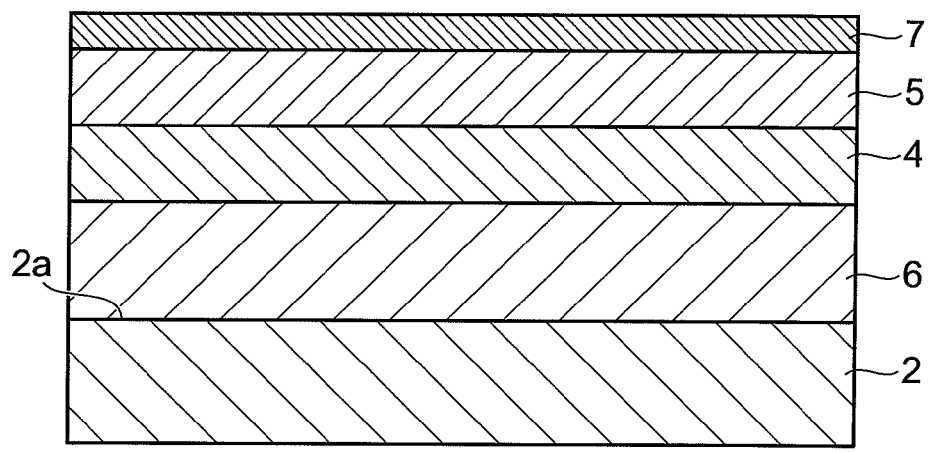
FIG. 5 is a process drawing for explaining a manufacturing method for the quantum cascade laser element of FIG. 1.

Next, a manufacturing method for the quantum cascade laser element 1 will be described. FIG. 5 to FIG. 7 are process drawings for explaining a manufacturing method for the quantum cascade laser element of FIG. 1.

First, as shown in FIG. 5, on one major surface 2a of the substrate 2 made of InP, an cladding layer 6 made of InP, an active layer 4 made of an InGaAs/InAlAs multiple quantum well structure, an cladding layer 5 made of InP, and a high-density InGaAs layer are formed in order by a molecular beam epitaxy (MBE) method or a metal-organic vapor phase epitaxy (MOVPE) method. At this time, the cladding layer 5 is formed so as to have a thickness within a range of 42±10% of the oscillation wavelength.

Then, by applying photolithography and etching to the high-density InGaAs layer, a diffraction grating 7 is formed at a fixed frequency to have a first-order Bragg condition.

Then, as shown in FIG. 6(a), a laminate 3 is formed by photolithography and etching so that a section orthogonal to the stripe direction has a mesa shape. At this time, the laminate 3 is formed so as to have a stripe width of approximately 3 μm to 30 μm.

Then, as shown in FIG. 6(b), at both sides of the laminate 3 and the diffraction grating 7 on the major surface 2a of the substrate 2, an insulating layer 8 made of Fe-doped InP is formed by an MOVPE method so as to bury the laminate 3 and the diffraction grating 7.

Then, as shown in FIG. 7(a), on one surface of the diffraction grating 7 and the insulating layer 8, an electrode layer 11 made of Ti/Au is formed by a vacuum vapor deposition method and an electrolytic plating method. At this time, by the vacuum vapor deposition method, a Ti layer and an Au layer are formed so as to have thicknesses of approximately 50 nm and 250 nm, respectively, and by the electrolytic plating method, the Au layer is formed so as to have a total thickness of approximately 3 μm to 10 μm.

Then, as shown in FIG. 7(b), the other major surface of the substrate 2 is polished to thin the substrate 2, and on the other major surface 2b of the thinned substrate 2, an electron layer 12 made of AuGe/Au is formed. Thereafter, by cleaving so as to have a resonator length of 1 mm to 5 mm, both end surfaces of the laminate 3 in the stripe direction are made into mirrors to form a laser oscillator. Also, one end surface of the laminate 3 in the stripe direction may be coated by a high reflective film of Au or the like.

As has been described above, in the quantum cascade laser element 1, a top-grating approach for which the diffraction grating 7 is formed on the laminate 3 is adopted, and thus in comparison with a buried-grating approach, deterioration in temperature characteristics of the laser element and decline in the yield and reproducibility are suppressed. In addition, since the thickness of the cladding layer 5 located between the active layer 4 and the diffraction grating 7 is within a range of 42±10% of the oscillation wavelength, weakening of light seeping from the active layer 4 to the diffraction grating 7 or an increase in light leakage is prevented. Consequently, by the quantum cascade laser element 1, a single-mode light can be reliably CW-oscillated even at room temperature or a temperature in proximity thereof.

Moreover, in the quantum cascade laser element 1, the material of the cladding layer 5 located between the active layer 4 and the diffraction grating 7 is InP, the laminate 3 is formed so that a section orthogonal to the stripe direction has a mesa shape, and further, the insulating layer 8 is formed at both sides of the laminate 3 on one major surface 2a of the substrate 2. These allow making CW oscillation of a single-mode light at room temperature or a temperature in proximity thereof further reliable.

Figure 8:
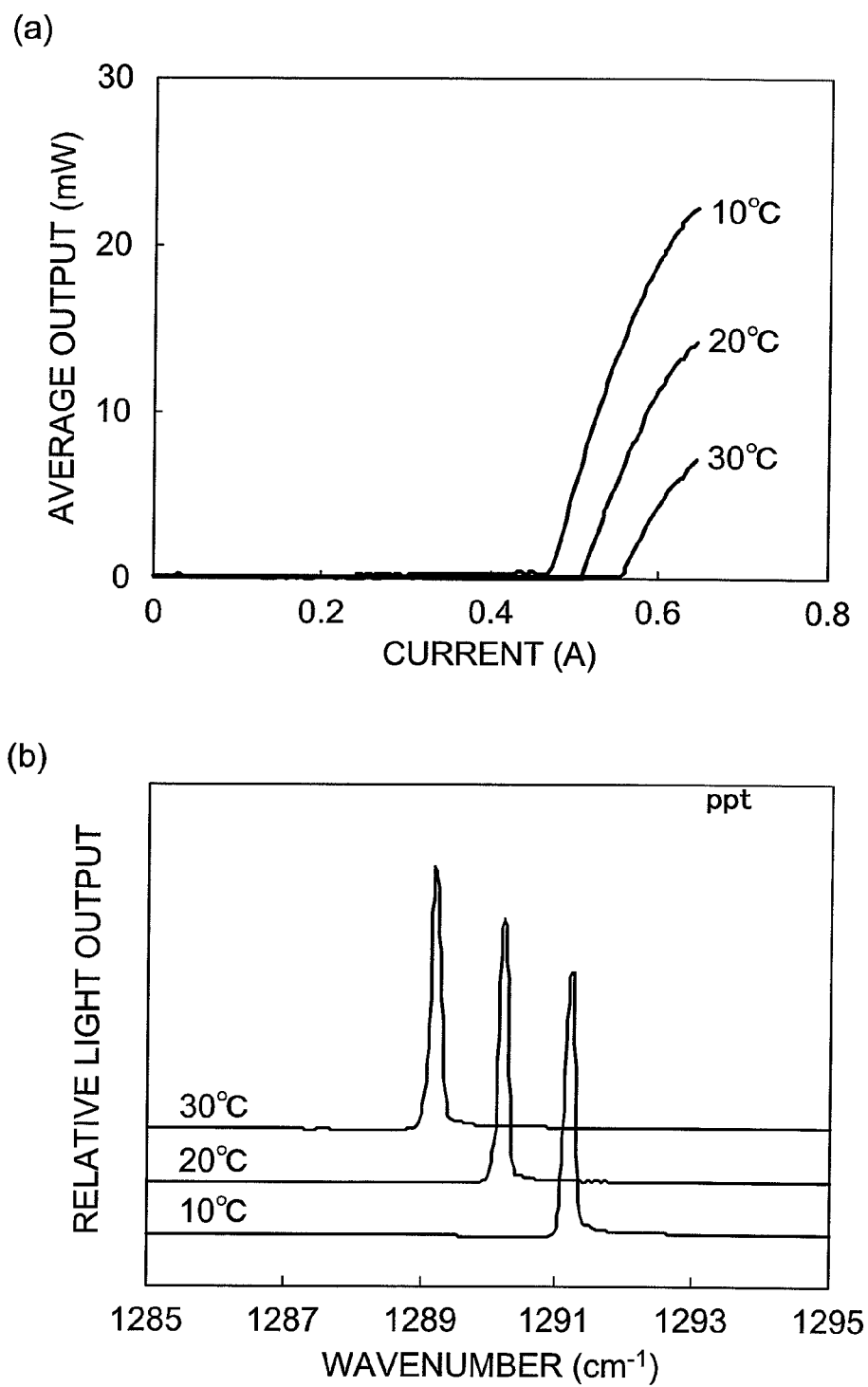
FIG. 8 are graphs showing evaluation results of quantum cascade laser elements of examples.
Figure 9:
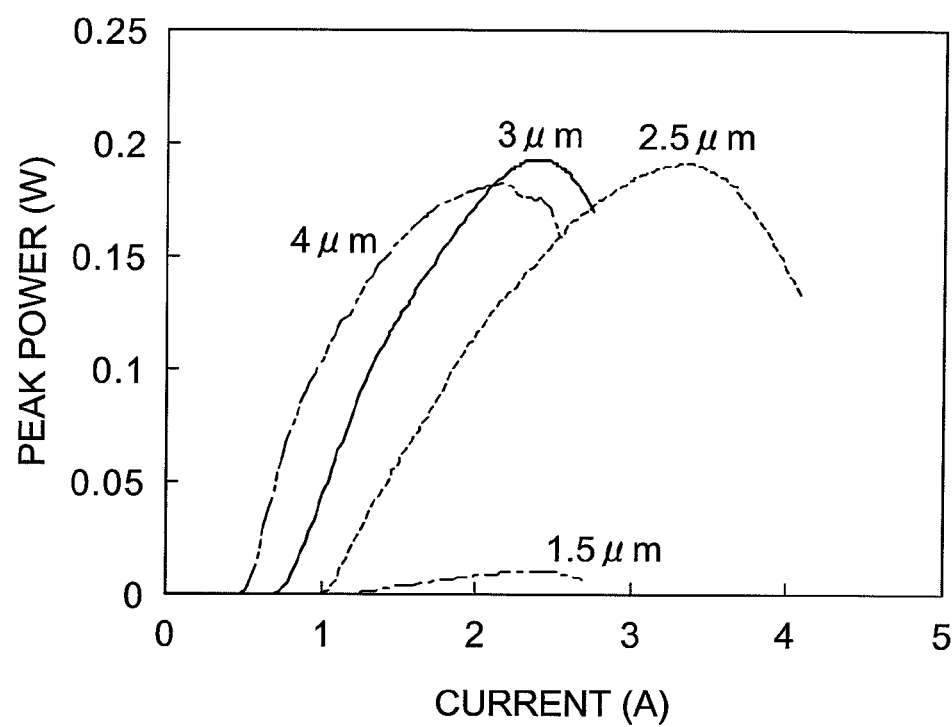
FIG. 9 is a graph showing evaluation results of quantum cascade laser elements of examples and a comparative example.

Here, description will be given of evaluation results of quantum cascade laser elements of examples. FIG. 8 are graphs showing evaluation results of a quantum cascade laser element of an example. FIG. 9 is a graph showing evaluation results of quantum cascade laser elements of examples and a comparative example.

The quantum cascade laser element of the example used for obtaining the evaluation results shown in FIG. 8 was manufactured as follows.

On one major surface of an n-type InP substrate, a laminate having a stripe structure and a diffraction grating were formed by a metal-organic chemical vapor deposition (MOCVD) method. An active layer was made of an InGaAs/InAlAs multiple quantum well structure in which 33 layers each of emitting layers and injection layers were alternately laminated, the thickness was 2 μm, and the stripe width was 4 μm.

Each of the cladding layers to be formed on both sides of the active layer was made of InP, and the thickness was 3 μm. The diffraction grating was made of high-density InGaAs, the thickness was 300 nm, the pitch (frequency) was 1216 nm, and the depth of grooves was 300 nm. Such a construction results in an oscillation wavelength of 7.7 μm. And, the thickness of the cladding layer located between the active layer and the diffraction grating became about 39% of the oscillation wavelength, which is within the range of 42±10% of the oscillation wavelength.

Then, an insulating layer made of Fe-doped InP was formed by buried growth until the insulating layer reached a thickness to completely bury the active layer. And, on one surface of the diffraction grating and the insulating layer, Ti/Au was vapor-deposited by a vapor deposition method and then Au was plated until the Au layer reached a total thickness of 8 μm by an electrolytic plating method, whereby an electrode layer was formed. Further, the other major surface of the n-type InP substrate was polished to thin the n-type InP substrate, and on the other major surface of the thinned n-type InP substrate, an electron layer made of AuGe/Au was formed. Thereafter, by cleaving so as to have a resonator length of 3 mm, both end surfaces of the laminate in the stripe direction were made into mirrors to form a laser oscillator.

Evaluation results of the quantum cascade laser element of the example manufactured as in the above are shown in FIGS. 8(a) and (b). The temperatures in the graphs of FIGS. 8(a) and (b) are drive temperatures (measurements of a heatsink temperature) controlled by a Peltier device.

The quantum cascade laser elements of the example indicated current-average output characteristics of FIG. 8(a) when being made to CW-oscillate a single-mode light. A thermopile was used for average output measurement. As shown in FIG. 8(a), in the quantum cascade laser elements of the examples, an average output of 8 mW was obtained at a temperature of 30° C.

The quantum cascade laser element of the example indicated wavenumber to relative light output characteristics of FIG. 8(b) when being made to CW-oscillate a single-mode light. A Fourier transform infrared spectrophotometer (FTIR) was used for spectral evaluation. The resolution was 0.125 cm$^{-1}$. As shown in FIG. 8(b), a single-mode operation was confirmed from +10° C. to +30° C., and it was thus confirmed that the oscillation wavelength could be continuously varied by temperature control.

The quantum cascade laser elements of examples used for obtaining the evaluation results shown in FIG. 9 were manufactured, with a thickness of the cladding layer located between the active layer and diffraction grating provided as 2.5 μm (32% of the oscillation wavelength), 3 μm (39% of the oscillation wavelength), and 4 μm (52% of the oscillation wavelength), by the same method as the manufacturing method for the quantum cascade laser element of the example described above. Moreover, the quantum cascade laser element of a comparative example used for obtaining the evaluation results shown in FIG. 9 was manufactured, with a thickness of the cladding layer located between the active layer and diffraction grating provided as 1.5 μm (19% of the oscillation wavelength), by the same method as the manufacturing method for the quantum cascade laser element of the example described above.

As shown in FIG. 9, in the quantum cascade laser elements of the examples where the thickness of the cladding layer located between the active layer and the diffraction grating was within the range of 42±10% of the oscillation wavelength, CW oscillation of a single-mode light at a temperature of 300K was confirmed. On the other hand, in the quantum cascade laser element of the comparative example where the thickness of the cladding layer located between the active layer and the diffraction grating was not within the range of 42±10% of the oscillation wavelength, CW oscillation of a single-mode light at a temperature of 300K was not confirmed.

The present invention is by no means limited to the embodiment described above. For example, even without providing the insulating layer 8, it is possible to CW-oscillate a single-mode light at room temperature or a temperature in proximity thereof.

According to the present invention, it becomes possible to reliably CW-oscillate a single-mode light even at room temperature or a temperature in proximity thereof.

What is claimed is:

1. A distributed feedback quantum cascade laser element that oscillates a single-mode light, comprising:
    a substrate;
    a laminate having a stripe structure formed on a major surface of the substrate; and
    a diffraction grating formed on the laminate, wherein
    the laminate has an active layer and cladding layers formed on both sides of the active layer in a direction orthogonal to the major surface of the substrate,
    the cladding layer located between the active layer and the diffraction grating has a thickness within a range of 42±10% of a wavelength of oscillating light,
    wherein the diffraction grating is a layer including InGaAs,
    wherein the cladding layer located between the active layer and the substrate is made of InP,
    wherein the active layer is made of an InGaAs/InAlAs multiple quantum well structure, and
    wherein the cladding layer located between the active layer and the diffraction grating is made of InP.

2. The distributed feedback quantum cascade laser element according to claim 1, wherein the laminate is formed so that a section orthogonal to a stripe direction has a mesa shape.

3. The distributed feedback quantum cascade laser element according to claim 1, wherein an insulating layer is formed at both sides of the laminate on the major surface of the substrate.

4. The distributed feedback quantum cascade laser element according to claim 3,
    wherein the insulating layer is made of Fe-doped InP,
    the insulating layer is formed by buried growth until the insulating layer reached a thickness to completely bury the active layer, and
    an upper electrode layer is formed on one surface of the diffraction grating and the insulating layer.

* * * * *